US008824202B2

(12) United States Patent
Berger et al.

(10) Patent No.: US 8,824,202 B2
(45) Date of Patent: Sep. 2, 2014

(54) SELF-REFERENCED MAGNETIC RANDOM ACCESS MEMORY CELLS

(75) Inventors: Neal Berger, Cupertino, CA (US); Jean-Pierre Nozières, Le Sappey en Chartreause (FR)

(73) Assignee: Crocus Technology S.A., Grenoble Cedex (FR)

( * ) Notice: Subject to any disclaimer, the term of this patent is extended or adjusted under 35 U.S.C. 154(b) by 181 days.

(21) Appl. No.: 12/832,472

(22) Filed: Jul. 8, 2010

(65) Prior Publication Data

US 2011/0007561 A1    Jan. 13, 2011

(30) Foreign Application Priority Data

Jul. 13, 2009  (EP) ..................... 09290563

(51) Int. Cl.
*G11C 11/16*  (2006.01)
(52) U.S. Cl.
CPC ..................... *G11C 11/16* (2013.01)
USPC ........................................ 365/171
(58) Field of Classification Search
USPC ........................................ 365/171
See application file for complete search history.

(56) References Cited

U.S. PATENT DOCUMENTS

| 7,023,724 | B2* | 4/2006 | Katti ............................. 365/158 |
| 7,129,555 | B2 | 10/2006 | Nozieres et al. |
| 7,332,781 | B2 | 2/2008 | Nozieres et al. |
| 2007/0070686 | A1* | 3/2007 | Boeve ........................... 365/158 |
| 2007/0278602 | A1* | 12/2007 | Raberg et al. ................. 257/421 |
| 2008/0084724 | A1* | 4/2008 | Nozieres et al. ................ 365/50 |
| 2009/0167912 | A1* | 7/2009 | Endo ............................. 348/300 |
| 2009/0251951 | A1* | 10/2009 | Yoshikawa et al. ........... 365/158 |
| 2009/0251957 | A1* | 10/2009 | Javerliac et al. .............. 365/171 |

* cited by examiner

*Primary Examiner* — Hoai V Ho
*Assistant Examiner* — Min Huang
(74) *Attorney, Agent, or Firm* — Pearne & Gordon LLP

(57) ABSTRACT

The present disclosure concerns a magnetic random access memory cell containing a magnetic tunnel junction formed from an insulating layer comprised between a sense layer and a storage layer. The present disclosure also concerns a method for writing and reading the memory cell comprising, during a write operation, switching a magnetization direction of said storage layer to write data to said storage layer and, during a read operation, aligning magnetization direction of said sense layer in a first aligned direction and comparing said write data with said first aligned direction by measuring a first resistance value of said magnetic tunnel junction. The disclosed memory cell and method allow for performing the write and read operations with low power consumption and an increased speed.

14 Claims, 2 Drawing Sheets

SELF-REFERENCED MAGNETIC RANDOM ACCESS MEMORY CELLS

FIELD

The present invention concerns magnetic random access memory (MRAM) based cells using a self-referenced read operation.

BACKGROUND

In the simplest implementation, magnetic random access memory (MRAM) cells comprise at least a magnetic tunnel junction formed of two magnetic layers separated by a thin insulating layer, where one of the layer, the so-called reference layer, is characterized by a fixed magnetization and the second layer, the so-called storage layer, is characterized by a magnetization which direction can be changed upon writing of the memory. When the respective magnetizations of the reference layers and the storage layer are antiparallel, the resistance of the magnetic tunnel junction is high ($R_{max}$), corresponding to a low logic state "0". On the other hand, when the respective magnetizations are parallel, the resistance of the magnetic tunnel junction becomes low ($R_{min}$), corresponding to a low logic state "1". The logic state of the MRAM cell is read by comparing its resistance state to a reference resistance $R_{ref}$, preferably derived from a reference cell or an array of reference cells, with a reference resistance of typically $R_{ref}=(R_{min}+R_{max})/2$, combined in-between the magnetic tunnel junction resistance of the high logic state "1" and the resistance of the low logic state "0".

In conventional practical implementations, the reference layer is "exchange biased" to an adjacent antiferromagnetic reference layer characterized by a critical temperature (above which the exchange bias vanishes) known as the blocking temperature $T_{BR}$, of the antiferromagnetic reference layer.

In an implementation of the MRAM cell using a thermally assisted switching (TAS) procedure, for example as described in U.S. Pat. No. 6,950,335, the storage layer is also exchange biased to an adjacent antiferromagnetic storage layer which blocking temperature $T_{BS}$ (the temperature at which the exchange bias of the antiferromagnetic storage layer vanishes) is lower than that the blocking temperature $T_{BR}$ of the antiferromagnetic reference layer pinning the reference layer. Below the blocking temperature $T_{BS}$, the storage layer is difficult and/or impossible to write. Writing is then performed by heating the magnetic tunnel junction above $T_{BS}$ but below $T_{BR}$, preferably but not limited to by sending a heating current through the magnetic tunnel junction, in order to free the magnetization of the storage layer, while simultaneously applying means of switching the magnetization of the storage layer. The latter can be performed either by a magnetic field, generated by a field current, or by the so-called spin transfer torque (STT) effect, where a spin transfer torque current, in which the spin is polarized, is passed through the magnetic tunnel junction. The magnetic tunnel junction is then cooled down below the blocking temperature $T_{BS}$, where the storage layer magnetization is "frozen" in the written direction.

The magnetic field magnitude required to switch the magnetization direction of the storage layer is proportional to the coercivity of the storage layer, which is large at small feature sizes and can be greatly enhanced in exchange biased films. In the other hand, the spin torque current must be lower than the heating current, therefore forcing the use of high heating currents, since the magnitude of spin torque current is large in TAS-MRAM cells (>1MA/cm$^2$).

Moreover, in the current implementation of the TAS-MRAM cell described above, the write operating temperature window defined by $T_{BR}-T_{BS}$ is typically small. Indeed, a blocking temperature $T_{BR}$ up to about 350° C. can be attained when the antiferromagnetic reference layer is made of a NiMn-based alloy, while a blocking temperature $T_{BS}$ ranging typically between 150° C. and 200° C. is achieved when the antiferromagnetic storage layer is made of an IrMn-based alloy or a FeMn-based alloy, respectively.

In the case of a magnetic memory device formed by assembling an array comprising a plurality of memory TAS-MRAM cells, the properties of the individual cells across the array may vary due to fabrication process fluctuations. This can result in a distribution of the blocking temperatures $T_{BR}$ and $T_{BS}$ for the array amounting to typically up to about ±30° C., further reducing the writing operating temperature window. These variations can also impact directly on the resistance of the magnetic tunnel junctions of the different MRAM cells, therein reducing the difference between the measured magnetic tunnel junction resistance and the reference cell resistance, $R_{min/max}-R_{ref}$. Consequently, a tight process control is required in order to produce a memory device having a high performance and a high efficiency, impacting on production yield and/or costs.

Moreover, when the magnetic memory device is used in extreme environments, where local ambient temperatures in the vicinity of the cells can be high, using an antiferromagnetic storage layer having a blocking temperature $T_{BS}$ higher than 200° C. can become necessary, further reducing the operating temperature window. Such high local temperatures can also be caused, alone or in addition to high ambient temperatures, by local current-induced heat transfer in the magnetic memory device itself or in a neighbouring magnetic memory device. Consequently, the above implementation may limit applications of the memory device in environments such as spatial, military, automotive, etc.

A high ambient local temperature can also result in a heating temperature that exceeds $T_{BR}$ during the writing procedure, resulting in freeing the magnetization of the reference layer and thus, erasing the cell data. In order to avoid this situation, a temperature controller is typically introduced within the circuit driving the heating current in order to account for ambient and/or local temperature fluctuations.

Finally, the speed of the writing procedure mostly depends on the speed at which the magnetic tunnel junction of the TAS-MRAM cell can be heated. Here, the more power sent into the magnetic tunnel junction the faster the heating, since high power heating is performed in adiabatic conditions instead of dissipative conditions. However, in conventional implementations of the TAS-MRAM cell, the heating speed is limited by possible overshooting the temperature above $T_{BR}$ when a high power is sent into the magnetic tunnel junction.

SUMMARY

The present application discloses a magnetic memory device and a method for writing and reading the memory device which overcome at least some limitations of the prior art.

According to the embodiments, a MRAM cell comprising: a magnetic tunnel junction formed from a sense layer, a storage layer, and an insulating layer being disposed between the sense and storage layers; a field line in communication with the magnetic tunnel junction; and a current line electrically connected to the magnetic tunnel junction; wherein said sense layer has a magnetization with a variable direction, and said storage layer has a magnetization that can be switched from a first stable direction to a second stable direction; and wherein during a write operation, a write data is written to said storage layer by switching the magnetization of said storage layer; and during a read operation, a first read field current having a first polarity is passed in said field line to align the magnetization of the sense layer in a first aligned magnetization direction according to said first polarity; and said first aligned magnetization direction of the sense layer is compared with the write data by passing a sense current through said magnetic tunnel junction via the current line to determine a first resistance value of the magnetic tunnel junction.

In an embodiment, the MRAM cell further comprises a selection transistor coupled with said magnetic tunnel junction and being selectable to heat said magnetic tunnel junction to a high temperature threshold during the write operation, by applying a heating current through said magnetic tunnel junction via the current line when the transistor is selected.

In another embodiment, the storage layer has a magnetocrystalline anisotropy that is oriented substantially perpendicularly to the magnetocrystalline anisotropy of the sense layer.

In yet another embodiment, a magnetic memory device comprises a device package, and an array of the MRAM cells disposed within said device package.

The present invention also encompasses a method for reading the MRAM cell comprising:

during a write operation, switching the magnetization of said storage layer to write data to said storage layer; and during a read operation, providing a first read field current with a first polarity to the field line, said first read field current inducing a first magnetic field, aligning said magnetization of the sense layer in a first aligned magnetization direction in accordance with said first polarity; and comparing said write data with said first aligned magnetization direction of the sense layer by passing a sense current in the current line to determine a first resistance value of said magnetic tunnel junction.

The disclosed memory cell and method allow for using a small read field current and thus for performing the write and read operations with low power consumption and an increased speed. The magnetic memory cell and device can be advantageously used in applications such as automotive and spatial/military where local ambient temperatures in the vicinity of the memory can be high.

BRIEF DESCRIPTION OF THE DRAWINGS

The preferred embodiments will be better understood with the aid of the description of an embodiment given by way of example and illustrated by the figures, in which.

DETAILED DESCRIPTION OF THE PREFERRED EMBODIMENTS

Figure 1:
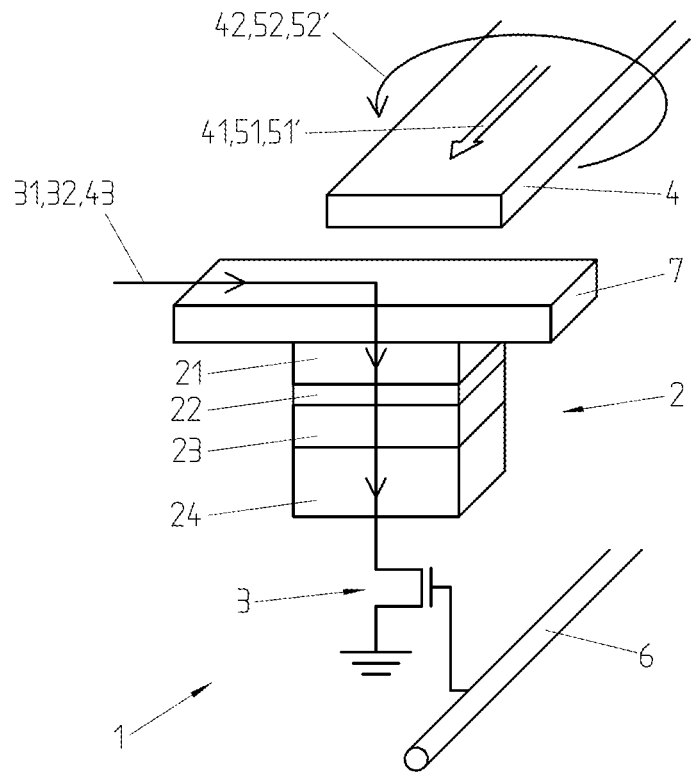
FIG. 1 shows a magnetic random access memory (MRAM) cell, according to an embodiment.

A magnetic random access memory (MRAM) cell 1 according to an embodiment is represented in FIG. 1. The MRAM cell 1 comprises a magnetic tunnel junction 2 formed from a sense layer 21, a storage layer 23, and an insulating layer 22 being disposed between the sense and storage magnetic layers 21, 23. The MRAM cell further comprises a field line 4 in communication with the magnetic tunnel junction 2, and a current line 7 electrically connected to the magnetic tunnel junction 2. In the example of FIG. 1, the current line 7 represented connected to the magnetic tunnel junction 2 on the side of the sense layer 21 and perpendicular to the field line 4. Other configurations of the current line 4 and current line 7 are however possible. For example, the field line 4 can be placed below the magnetic tunnel junction 2 and the storage layer 23 can be in contact with the current line 7. In the example of FIG. 1, the MRAM cell 1 also comprises a CMOS selection transistor 3 electrically coupled with said magnetic tunnel junction 2, for example, on the side of the storage layer 23 and being selectable by a word line 6 to address each MRAM cell 1 individually by passing a current through the magnetic tunnel junction 2.

Preferably, the storage layer 23 is made of a hard ferromagnetic material while the sense layer 21 is made of a low coercivity, soft ferromagnetic material. The ferromagnetic materials include typically iron, cobalt nickel or their alloys. Preferably, the insulating layer 22 is a thin layer, typically in the nanometer range and is formed, for example, from any suitable insulating material, such as alumina or magnesium oxide.

In an embodiment, the storage layer 23 has a magnetization that can be switched from a first stable direction to a second stable direction. In the example of FIG. 1, this is performed by pinning the storage layer 23 by an antiferromagnetic storage layer 24 comprised in the magnetic tunnel junction 2. More particularly, the antiferromagnetic storage layer 24, preferably placed adjacent to the storage layer 23, exchange biases, or pins, the magnetization of the storage layer 23 when a temperature within the antiferromagnetic layer 24 is lower than a blocking temperature $T_{BS}$ of the antiferromagnetic storage layer 24. The antiferromagnetic layer 24 unpins, or frees, the magnetization of the storage layer 23 when the temperature is above the blocking temperature $T_{BS}$. In contrast, the sense layer 21 is not exchange biased and its magnetization has a direction that can be varied freely, for example, due to thermal agitation and thus, its magnetization can be freely aligned in a magnetic field.

During a thermally assisted switching (TAS) write operation of the MRAM cell 1, the magnetic tunnel junction 2 is heated by applying a heating current 31 through the magnetic tunnel junction 2 via the current line 7, when the selection transistor 3 is in a passing mode. The magnetic tunnel junction 2 can be heated to a high temperature threshold lying above the blocking temperature $T_{BS}$, for example above 120° C., where the exchange coupling between the antiferromagnetic layer 24 and the storage layer 23 disappears and the magnetization of the storage layer 23, being no more pinned, can be freely adjusted. Simultaneously or after a short time delay, once the magnetic tunnel junction 2 has reached the high temperature threshold, a moderate switching field current 41 is passed through the field line 4. The switching field current 41 induces a switching magnetic field 42 able to switch the magnetization of the storage layer 23 according to the switching magnetic field 42, to write a write data to the storage layer 23. At the high threshold temperature the magnetization of the storage layer 23 can be freely adjusted, facilitating the switching operation.

After the temperature of the magnetic tunnel junction 2 has reached the high temperature threshold, the selection transistor 3 can be deselected (or set in a blocked mode) to inhibit the heating current 31 from being applied to said magnetic tunnel junction 2, and cooling the magnetic tunnel junction 2. The switching field current 42 can be maintained during the cooling of the magnetic tunnel junction 2 and switched off once the magnetic tunnel junction 2 has reached a low temperature threshold, lying below the blocking temperature $T_{BS}$ of the antiferromagnetic layer 24, where the magnetization of the storage layer 23 is frozen in the written state. Since the magnetization of the storage layer 23 is exchange biased by the antiferromagnetic layer 24 at the low temperature threshold, its orientation is not subject to thermal fluctuation and is stable in time retaining the written data.

Other arrangement of the storage layer 23 are possible such that its magnetization that can be switched from the first stable direction to the second stable direction. In another embodiment not represented, the magnetic tunnel junction 2 has an anisotropic shape with high aspect ratios, for example, 1.5 or more. In such an anisotropic-shaped magnetic tunnel junction 2, the write data can be written to the storage layer 23 by switching the magnetization of the storage layer 23 from the first stable direction to the second stable direction without requiring using the antiferromagnetic layer 24 and/or the TAS writing operation described above. The high aspect ratio of the magnetic tunnel junction 2 provides a good thermal and/or temporal stability of the storage layer magnetization and thus of the written write data. On the other hand, the switching magnetic field 42 required to switch the magnetization of the storage layer 23 from the first stable direction to the second opposed stable direction is significant and therefore the power consumed during the write operation can be large.

In yet another embodiment, the write operation of the MRAM cell 1 is performed by passing a write current 43 through the magnetic tunnel junction 2 via the current line 7 when the selection transistor 3 is in a passing mode, using a so-called "spin transfer torque" (STT) effect. In this STT-based write operation, the write current 43 can become spin polarized by passing through the sense layer 21, according to the flow direction of the write current 43. The polarized spins of the write current 43 passing through the storage layer 23 are then in majority oriented along the magnetization direction of the sense layer 21, and are able to switch the magnetization of the storage layer 23 accordingly for sufficient amplitude of the spin-polarized the write current 43. A write operation of a MRAM cell based on a spin-polarized write current is described in U.S. Pat. Nos. 7,332,781 and 7,129,555, the disclosure of which is hereby incorporated by reference in its entirety and for all purposes.

Alternatively, the write current 43 can become spin polarized when passing through a polarizing magnetic layer (not shown). In this case, the polarized spins of the write current 43 passing through the storage layer 23 are in majority oriented along the magnetization direction of the polarizing magnetic layer, and are able to switch the magnetization of the storage layer 23 accordingly.

In another variant of the embodiment shown in FIG. 1, switching of the storage layer magnetization using the STT-based write operation can be thermally assisted as described above. More particularly, in the case the storage layer 23 is exchanged-biased by the antiferromagnetic layer 24, switching the storage layer magnetization with the spin-polarized write current 43 can be combined with the TAS write operation. Here, during the write operation, the magnetic tunnel junction 2 is heated by passing the heating current 31 through the junction 2 via the current line 7 when the selection transistor 3 is in the passing mode. The spin-polarized write current 43 is provided in the magnetic tunnel junction 2 simultaneously or after a short time delay, once the magnetic tunnel junction 2 has reached the high temperature threshold. The TAS write operation can improve the stability of the storage layer magnetization in the written state.

Advantageously, the spin-polarized write current 43 required for switching the magnetization of the storage layer 23 depends on the magnetic anisotropy of the magnetic tunnel junction 2. In particular, the magnitude of the spin-polarized current 43 is independent from the size and shape of the magnetic tunnel junction 2, and thus its magnitude remains constant when the size of the magnetic tunnel junction 2 decreases. In contrast, the switching magnetic field 42 is an extrinsic property of the magnetic tunnel junction material, and thus dependent on the geometry of the magnetic tunnel junction 2 and on possible presence of defects in the magnetic tunnel junction 2. Moreover, the magnitude of the switching field current 41, and thus power consumption, increases as the size of the magnetic tunnel junction 2 decreases.

Figure 2:
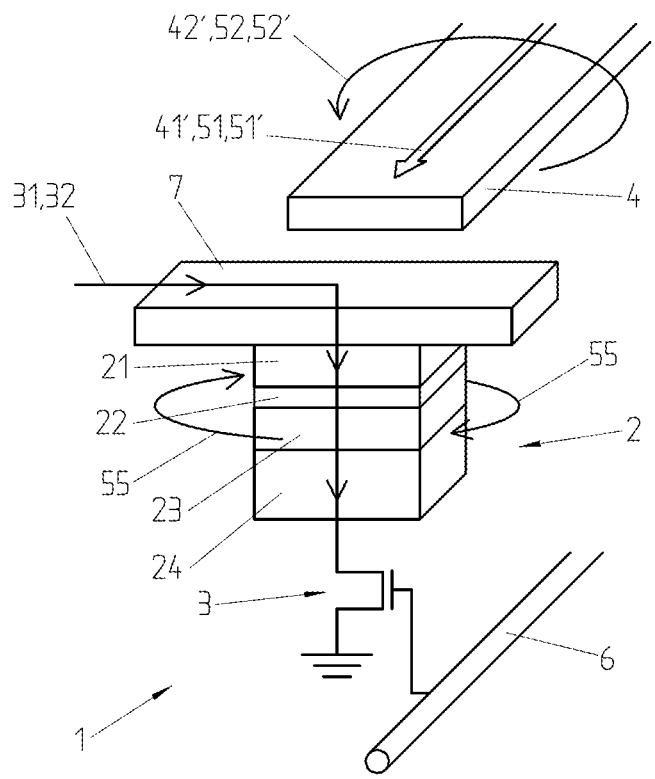
FIG. 2 shows the MRAM according to another embodiment.

In a preferred embodiment represented in FIG. 2, the write operation is performed by passing a saturation field current 41' in the field line 4 to induce a saturation magnetic field 42' capable of saturating the magnetization of the sense layer 21 in a direction according to the induced saturation magnetic field 42'. The saturated sense layer 21 induces in turn a local magnetic stray field 55 coupling with the storage layer 23 in a closed magnetic flux configuration. The magnetization of the storage layer 23 is then switched in accordance with said local magnetic field 55 from a first stable direction to a second stable direction. Due to the small distance between the storage layer 23 and the sense layers 21, typically in the nanometer range, the magnetic coupling between the sense layer 21 and the storage layer 23 is far more efficient than the magnetic coupling between the field line 4 and the storage layer 23 in the case the write operation is based on the switching field current 41. Moreover, the material of the sense layer 21 can be chosen to minimize the magnetic field required to switch the magnetization of the sense layer 21.

During a read operation of the MRAM-based cell 1, in a first read cycle, a field current, here a first read field current 51 having a first polarity, is passed through the field line 4. The first read field current 51 induces a magnetic field, here a first read magnetic field 52, capable of aligning the magnetization of the sense layer 21 in a first aligned magnetization direction, according to the first polarity of the read field current 51. In the MRAM cell configuration of FIG. 1, the sense layer 21 is not exchange-biased and its magnetization can be freely aligned in the magnetic field 51. For example, there is no need to heat the junction 2 to facilitate the switching of the sense layer magnetization.

The first aligned magnetization direction of the sense layer 21 is then compared with the write data, or the switched magnetization of the storage layer 23, by passing a sense current 32 though the magnetic tunnel junction 2 via the current line 7, when the selection transistor 3 is in the passing mode. Measuring a voltage across the magnetic tunnel junction 2 when the sense current 32 is passed yields a corresponding first resistance value $R_1$ of the magnetic tunnel junction 2. In the case the magnetization of the sense layer 21 is aligned substantially parallel to the magnetization direction of the storage layer 23, the first resistance value $R_1$ is small ($R_1=R_{min}$). On the other hand, in the case the magnetization of the sense layer 21 is aligned substantially antiparallel to the magnetization direction of the storage layer 23, the measured first resistance value is high ($R_1=R_{max}$). The write data written in the MRAM cell 1 can then be determined by comparing the first resistance value $R_1$ to a reference resistance $R_{ref}$ from a reference cell (not shown) or from a group of reference cells (also not shown), where the reference resistance $R_{ref}$ has a resistance typically halfway between the low and high first resistance values $R_{min}$ and $R_{max}$.

Since the magnetization of the sense layer 21 can be freely aligned, the first read field current 51 required to align the sense layer magnetization can be much lower than the switching field current 41, or saturation field current 41', used to switch the magnetization of the storage layer 23. Moreover, since the read operation is performed at a temperature at which the magnetization of the storage layer 23 is stable, for example being exchange biased by the antiferromagnetic layer 24, the switching of the storage layer 23 by the first read field current 51 during the read operation is unlikely.

In another embodiment, the read operation of the MRAM-based cell 1, further comprises a second read cycle including providing a second read field current 51' to the field line 4, the second read field current 51' having a second polarity opposed to the first polarity. The second read field current 51' induces a second reading magnetic field 52' capable of aligning the magnetization of the sense layer 21 in a second aligned magnetization direction, in accordance with said second polarity of said second read field current 51'.

The second aligned magnetization of the sense layer 21 is then compared with the write data by passing the sense current 32 though the magnetic current junction 2, via the current line 7, when the selection transistor 3 is in the passing mode. Measuring a voltage across the magnetic tunnel junction 2 when the sense current 32 is passed through the magnetic tunnel junction 2 yields a corresponding second resistance value $R_2$ of the magnetic tunnel junction 2.

Figure 3:
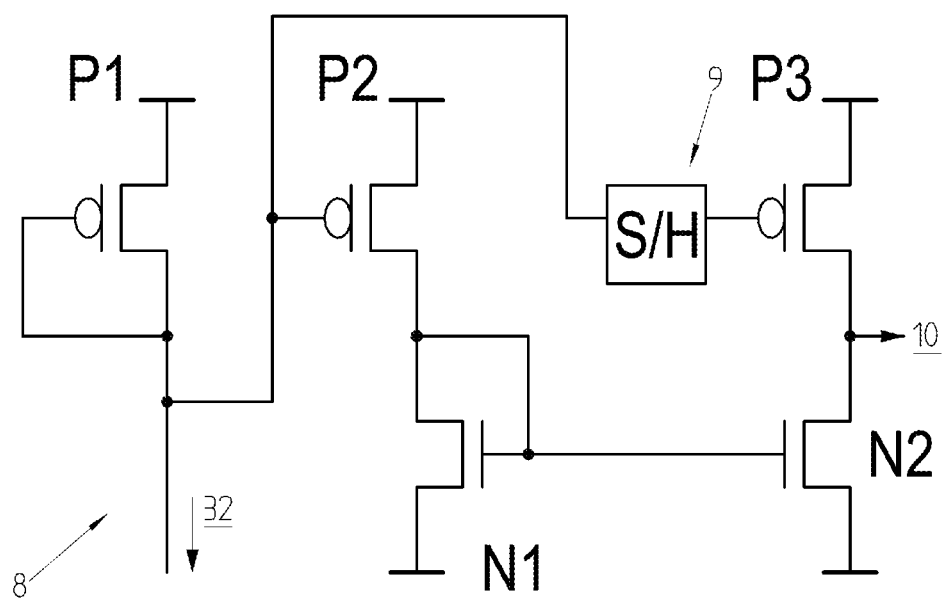
FIG. 3 illustrates a circuit for performing a read operation in the MRAM cell, according to an embodiment.

FIG. 3 shows a circuit 8 for performing the read operation and comprises a source transistor P1 and a mirror transistor P3. The source transistor P1 is capable of sourcing the sense current 32 when the first or second read field current 51, 51' is passed in the field line 4 during the first or second read cycle of the read operation. The circuit 8 further comprises a sample/hold (S/H) circuit 9 to store a measured magnetic tunnel junction resistance value. For example, after the measured current value corresponding to the first resistance value $R_1$ can be stored in the S/H circuit 9 and mirrored to the mirror transistor P3. Also shown in FIG. 3 is a current mirror comprising transistors P2, N1, and N2. The transistors P2 and N1 mirror a current to transistor N2, which sinks a current substantially equal to the sense current 32. An output stage 10 drives an output current (not shown) which corresponds substantially to the difference between the magnetoresistance $\Delta R$. The output current can be amplified by an amplifier (not shown) to generate a digital data output.

The write data written in the MRAM cell 1 can then be determined by a difference between the second resistance value $R_2$, and the first resistance value $R_1$ measured in the first read cycle and possibly stored in the S/H circuit 9. The difference between the first and second resistance values $R_1$, $R_2$, is also called magnetic tunnel magnetoresistance or magnetoresistance $\Delta R$. For example, in the case the write data has a logic state of "1", if the first read cycle of the read operation is performed with the first read field current 51 having a logic state of "0", the measured first resistance value is low ($R_1=R_{min}$). Conversely, if the second read cycle of the read operation is performed with the second read field current 51' having a logic state of "1", the measured second resistance value is high ($R_1=R_{max}$). Therefore, the difference between the stored first resistance value $R_1$ and the second resistance value $R_2$ yields a negative magnetoresistance $\Delta R$. In the contrary, a positive magnetoresistance $\Delta R$ is obtained for a write data of "0" and the same read operation sequence as above.

The read operation comprising the first and second read cycles is also called self-referenced since the use of the reference cell is not required.

Alternatively, the first and second resistance values $R_1$, $R_2$ can be determined by applying a voltage bias across the magnetic tunnel junction 2 and measuring the corresponding current.

In yet another embodiment (not represented), the first read field current 51 has an alternating polarity and induces an alternating magnetic field aligning the magnetization of the sense layer 21 alternatively, in accordance to the alternating polarity of the first read field current 51. Preferably, the alternating first read field current 51 aligns alternatively the magnetization of the sense layer 21 without switching completely its magnetization. Here, the measured first resistance value $R_1$ varies alternatively with the varying magnetization of the sense layer 21. The data written in the MRAM cell 1 can be determined by comparing the varying first resistance value $R_1$ with the alternating first read field current 51. For example, if the write data has a logic state of "1", corresponding to the magnetization of the sense layer 21 being aligned respectively antiparallel and parallel with the magnetization of the storage layer 23, the measured varying first resistance value $R_1$ is in phase with the alternating first read field current 51. Conversely, the measured varying first resistance value $R_1$ is out of phase with the alternating first read field current 51 when the write data has a logic state "0", corresponding to the magnetization of the sense layer 21 being aligned respectively parallel and antiparallel with the magnetization of the storage layer 23.

In an embodiment, a magnetic memory device comprises a plurality of the MRAM cells 1 disclosed herein, for example arranged in rows and columns. The magnetic memory device can comprise a device package in which the MRAM cells 1 are disposed. In the magnetic memory device, the field line 4 can be arranged such as to be in communication with the magnetic tunnel junction 2 of the MRAM cells 1 in a row, and the current line 7 electrically connected to the magnetic tunnel junction 2 of the MRAM cells 1 in a column. Since the read operation does not require the use of a reference cell, the reading margin of the memory device is less sensitive to an MRAM cell width dispersion than in memory devices comprising conventional MRAM cells, and larger arrays can be used.

The disclosure is susceptible to various modifications and alternative forms, and specific examples thereof have been shown by way of example in the drawings and are herein described in detail. It should be understood, however, that the disclosure is not to be limited to the particular forms or methods disclosed, but to the contrary, the disclosure is to cover all modifications, equivalents, and alternatives.

For example, in an embodiment not represented, the storage layer 23 has a magnetocrystalline anisotropy that is oriented substantially perpendicularly to the magnetocrystalline anisotropy of the sense layer 21. In such arrangement, prior to the write and read operations, the sense layer 21 has a magnetization that is oriented substantially perpendicular to the one of the storage layer 23. This arrangement is advantageous, since the first and/or second read magnetic field 51, 51' with a small amplitude is able to induce a linear variation in the first and/or second resistance values $R_1$, $R_2$, allowing for determining the magnetoresistance $\Delta R$ from small voltage variations, or small variations of first and/or second resistance values $R_1$, $R_2$. Consequently, using the first and/or second read field currents 51, 51' with an alternating polarity allows for using smaller read field current amplitudes than when the polarity is not alternating, since the direction of the magnetization of the sense layer 21 needs only to be switched partially in order to obtain a readout signal. Furthermore, using smaller read field current amplitudes allows for increased speed of the reading procedure.

The MRAM cell 1 does not require aligning the magnetization of the sense layer 21 during the manufacturing process, as it is usual with conventional MRAM cells where the sense layer 21 remains aligned throughout the life of the memory cell. In the MRAM cell 1, the magnetization direction of the sense layer 21 can vary freely and is aligned only during the read operation. Therefore, the sense layer 21 can be optimized for the read operation. For example, the sense layer 21 can have a low coercivity and a high magnetoresistance ΔR. The first and/or second read field currents 51, 51' can also be minimized by using a material that has a very low switching field for the sense layer 21.

Moreover, the magnetic tunnel junction 2 can be optimized to favor parameters such as process control, write power, etc., without compromising the read margin. For example, the insulating layer 22 can be made of $Al_2O_3$ instead of MgO in order to make it easier to manufacture. The storage layer 23 and/or the sense layer 21 can be made of NiFe-based alloys instead of CoFeB-based alloys in order to obtain a lower switching field.

Furthermore, since the magnetization of the sense layer 21 is not pinned, the temperature at which the magnetic tunnel junction 2 can be heated is only limited upward by possible irreversible structural changes in the magnetic layers of the junction 2, such as layers interdiffusion (typically occurring around 400° C.). In the case of the TAS-based read operation, the heating current 31 can be controlled only to heat the magnetic tunnel junction 2 at a temperature that is above the blocking temperature $T_{BS}$ of the antiferromagnetic layer 24, and controlling the magnetic tunnel junction 2 for ambient temperature fluctuations is not required. Consequently, a high heating current 31 can be used in adiabatic regime without the risk of a temperature overshoot if the heating current pulse duration is too long. This adiabatic regime is much faster than a diffusive regime, allowing, for example, to use a heating current pulse 31 having duration of a few nanoseconds, compared to more than 10 ns in the case of conventional TAS-MRAM cells. This is advantageous in SRAM-like or DRAM-like applications.

REFERENCE NUMBERS AND SYMBOLS

1 magnetic random access memory (MRAM) cell
2 magnetic tunnel junction
21 sense layer
22 insulating layer
23 storage layer
24 antiferromagnetic layer
3 selection transistor
31 heating current
32 sense current
4 field line
41 switching field current
41' saturation field current
42 switching magnetic field
42' saturation magnetic field
43 spin polarized write current
51 first read field current
52 first read magnetic field
51' second read field current
52' second read magnetic field
55 local magnetic field
6 word line
7 current line
8 circuit
9 sample/hold (S/H) circuit
10 output stage
P1 source transistor
P3 mirror transistor
N2 sink transistor
$R_1$ first resistance value of the magnetic tunnel junction
$R_2$ second resistance value of the magnetic tunnel junction
$R_{min}$ low resistance of the magnetic tunnel junction
$R_{max}$ high resistance of the magnetic tunnel junction
$R_{ref}$ reference resistance
ΔR magnetoresistance
$T_{BR}$ blocking temperature of the antiferromagnetic reference layer
$T_{BS}$ blocking temperature of the antiferromagnetic layer

The invention claimed is:

1. A method for writing and reading a magnetic random access memory (MRAM) cell comprising a magnetic tunnel junction formed from a sense layer having a magnetization direction that can be freely aligned, a storage layer having a magnetization direction that can be switched when the magnetic tunnel junction is heated to a high temperature threshold and that is pinned when the magnetic tunnel junction is at a low temperature threshold, and an insulating layer being disposed between the sense and a storage layers; a field line in communication with the magnetic tunnel junction; and a current line electrically connected to the magnetic tunnel junction; the method comprising :

during a write operation,
    passing a saturation field current in the field line to induce a saturation magnetic field;
    saturating the magnetization of the sense layer in a direction according to the induced saturation magnetic field for inducing a local magnetic field; and
    switching said magnetization of said storage layer according to the local magnetic field; and during a read operation,
    aligning magnetization direction of said sense layer in a first aligned direction;
    comparing said write data with said first aligned direction by measuring a first resistance value of said magnetic tunnel junction;
    aligning the magnetization of the sense layer in a second aligned magnetization direction;
    comparing said write data with said second aligned direction by measuring a second resistance value of said magnetic tunnel junction; and
determining a difference between the first resistance value and the second resistance value.

2. The method according to claim 1, wherein said aligning magnetization direction of said sense layer comprises providing a first read field current to the field line inducing a first read magnetic field, said first aligned direction being aligned in accordance to a first polarity of the first read magnetic field.

3. The method according to claim 2, wherein said first read field current has an alternating polarity inducing an alternating first read magnetic field.

4. The method according to claim 1, wherein said cell further comprises a sample/hold circuit, and wherein the first resistance value determined during the first read operation is stored in the sample/hold circuit.

5. The method according to claim 1, wherein said aligning magnetization direction of said sense layer comprises providing a second read field current to the field line inducing a second read magnetic field, said second aligned direction being aligned in accordance to a second polarity of the second read magnetic field opposed to said first polarity.

6. The method according to claim 1, wherein said measuring a first or second resistance value comprises passing a sense current in the current line.

7. The method according to claim 1, wherein said switching magnetization direction of said storage layer comprises providing a switching field current in the field line inducing a switching magnetic field, the magnetization of the storage layer being switched according to the switching magnetic field.

8. The method according to claim 1, wherein said switching magnetization direction of said storage layer comprises passing a spin polarized write current through said magnetic tunnel junction via the current line.

9. The method according to claim 1, wherein said magnetic memory cell further comprises a selection transistor electrically coupled with said magnetic tunnel junction, and
wherein said heating the magnetic tunnel junction comprises applying a heating current through the magnetic tunnel junction via the current line by selecting the selection transistor.

10. A magnetic memory device comprising
a plurality of magnetic random access memory (MRAM) cells arranged in rows and columns, each MRAM cell comprising a magnetic tunnel junction formed from a sense layer, a storage layer, an insulating layer being disposed between the sense and storage layers, and an antiferromagnetic storage layer exchange biasing a magnetization of the storage layer such that said magnetization can be switched from an initial stable direction to a switched stable direction when the magnetic tunnel junction is at a high temperature threshold and is frozen when the magnetic tunnel junction is at a low temperature threshold;
a field line in communication with the magnetic tunnel junction of the MRAM cells in a row and adapted to provide a field current such as to generate a magnetic field;
a current line electrically connected to the magnetic tunnel junction of the MRAM cells in a column and adapted to provide a heating current for heating the magnetic tunnel junction at the high temperature threshold; and
a selection transistor electrically coupled with said magnetic tunnel junction an destined to apply or inhibit the heating current provided in the current line;
wherein said sense layer has a magnetization direction that can be freely aligned in a first and second aligned direction when the magnetic tunnel junction is at the low temperature threshold and when a field current inducing a magnetic field is provided to the field line, during a read operation, wherein
said storage layer has a magnetocrystalline anisotropy that is oriented substantially perpendicularly to the magnetocrystalline anisotropy of the sense layer.

11. The memory device according to claim 10, further comprising a circuit including a sample/hold circuit to store a measured magnetic tunnel junction resistance value.

12. The memory device according to claim 10, wherein each MRAM cell further comprises a selection transistor electrically coupled with the magnetic tunnel junction and being selectable to heat said magnetic tunnel junction to a high temperature threshold during the write operation, to apply a heating current through said magnetic tunnel junction via the current line.

13. The method according to claim 1, wherein said switching magnetization direction of said storage layer comprises:
heating the magnetic tunnel junction to the high temperature threshold, said aligning magnetization direction being performed once the magnetic tunnel junction has reached the high temperature threshold; and
cooling the magnetic tunnel junction to the low temperature threshold.

14. A magnetic memory device comprising:
a plurality of magnetic random access memory (MRAM) cells arranged in rows and columns, each MRAM cell comprising a magnetic tunnel junction formed from a sense layer, a storage layer, an insulating layer being disposed between the sense and storage layers, and an antiferromagnetic storage layer exchange biasing a magnetization of the storage layer such that said magnetization can be switched from an initial stable direction to a switched stable direction when the magnetic tunnel junction is at a high temperature threshold and is frozen when the magnetic tunnel junction is at a low temperature threshold;
a field line in communication with the magnetic tunnel junction of the MRAM cells in row and adapted to provide a field current such as to generate a magnetic field;
a current line electrically connected to the magnetic tunnel junction of the MRAM cells in a column and adapted to provide a heating current for heating the magnetic tunnel junction at the high temperature threshold; and
a selection transistor electrically coupled with said magnetic tunnel junction and destined to apply or inhibit the heating current provided in the current line,
wherein said sense layer has a magnetization direction that can be freely aligned at the low temperature threshold in a first and second aligned direction when the magnetic tunnel junction is at the low temperature threshold and when the magnetic field is generated, during a read operation; and
wherein said storage layer has a magnetocrystalline anisotropy that is oriented substantially perpendicularly to the magnetocrystalline anisotropy of the sense layer.

* * * * *